United States Patent
Hatai et al.

(10) Patent No.: US 7,432,616 B2
(45) Date of Patent: Oct. 7, 2008

(54) INVERTER DEVICE

(75) Inventors: Akira Hatai, Tokyo (JP); Mahito Unno, Tokyo (JP); Masakatsu Daijou, Tokyo (JP); Kiyoshi Eguchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/514,914

(22) PCT Filed: Mar. 17, 2003

(86) PCT No.: PCT/JP03/03134

§ 371 (c)(1),
(2), (4) Date: Nov. 17, 2004

(87) PCT Pub. No.: WO2004/084395

PCT Pub. Date: Sep. 30, 2004

(65) Prior Publication Data

US 2005/0169018 A1   Aug. 4, 2005

(51) Int. Cl.
*H02J 7/10* (2006.01)
*G01R 31/12* (2006.01)

(52) U.S. Cl. .................. 307/66; 324/548; 320/167
(58) Field of Classification Search ............ 307/48, 307/64, 66; 324/548, 678; 320/127, 129, 320/134, 135, 136, 166, 167
See application file for complete search history.

(56) References Cited

U.S. PATENT DOCUMENTS

| | | | | |
|---|---|---|---|---|
| 5,148,043 A | * | 9/1992 | Hirata et al. ............ | 307/66 |
| 5,497,095 A | * | 3/1996 | Ueyama et al. .......... | 324/537 |
| 5,804,973 A | * | 9/1998 | Shinohara et al. ....... | 324/548 |
| 5,914,582 A | * | 6/1999 | Takamoto et al. ....... | 318/801 |
| 6,369,461 B1 | * | 4/2002 | Jungreis et al. ......... | 307/46 |
| 6,580,279 B1 | * | 6/2003 | Baumgartner et al. ... | 324/678 |
| 6,678,174 B2 | * | 1/2004 | Suzui et al. ............ | 363/55 |
| 6,751,561 B2 | * | 6/2004 | Oh ....................... | 702/60 |
| 6,880,967 B2 | * | 4/2005 | Isozumi et al. ......... | 374/102 |

FOREIGN PATENT DOCUMENTS

| JP | 02-040572 | 2/1990 |
|---|---|---|
| JP | 11-89264 A | 3/1999 |
| JP | 11-98854 A | 4/1999 |
| JP | 11-231008 A | 8/1999 |
| JP | 2000-152643 | 5/2000 |
| JP | 2002-165357 | 6/2002 |

OTHER PUBLICATIONS

Japanese Office Action dated Dec. 4, 2007.

* cited by examiner

*Primary Examiner*—Gary L Laxton
(74) *Attorney, Agent, or Firm*—Sughrue Mion, PLLC

(57) ABSTRACT

In the inverter device of the invention, when a power source connected to an electrolytic capacitor 5 is interrupted, a switching control circuit 6a controls switching elements of an inverter main circuit 7a to operate to supply a current to a load, thereby discharging charges of the electrolytic capacitor 5, and an electrolytic capacitor electrostatic capacitance calculator 10a calculates the electrostatic capacitance of the electrolytic capacitor, on the basis of: a discharged charge amount which is obtained from an outflow current Ic from the electrolytic capacitor 5, and a discharge time; and a discharge voltage ΔV which is a voltage drop from beginning of discharging of the electrolytic capacitor 5.

18 Claims, 7 Drawing Sheets

INVERTER DEVICE

TECHNICAL FIELD

The present invention relates to an inverter device in which the life of an electrolytic capacitor used in the inverter device can be determined.

BACKGROUND ART

As well known, an electrolytic capacitor is used in a main circuit smoothing section of a voltage source inverter device. Such an electrolytic capacitor has a limited life. Usually, when the designed time of an inverter device has elapsed, it is therefore deemed that the life of an electrolytic capacitor has expired, and the electrolytic capacitor is replaced with a new one. However, the life of an electrolytic capacitor is largely varied depending on the environment in which an inverter device is used. Therefore, there are a case where, although an electrolytic capacitor has not yet deteriorated, the capacitor is replaced with a new one after the designed constant time has elapsed, and an opposite case where, although an electrolytic capacitor has deteriorated, the life of the capacitor is not deemed to expire and hence the capacitor is not replaced because the designed constant time has not yet elapsed.

An inverter device in which the life of an electrolytic capacitor used in the inverter device can be determined is disclosed in Patent literature 1 (JP-A-11-98854). The inverter device which is disclosed in Patent literature 1, and in which an electrolytic capacitor is used in a main circuit smoothing section comprises electrolytic capacitor life determining means having: a discharge resistor which is connected in parallel to the electrolytic capacitor; a voltage detecting section which monitors the voltage between the terminals of the electrolytic capacitor; and a judging section which, when a voltage supply to the electrolytic capacitor is interrupted, measures the discharge time constant t (t=C·R) that is determined by the discharge resistance R and the electrostatic capacitance C of the electrolytic capacitor, and which, when an electrostatic capacitance calculated from the measured value exceeds an allowable range of the electrostatic capacitance of the electrolytic capacitor that is previously obtained as a reference, judges that the life of the electrolytic capacitor has expired.

A capacitor life diagnostic apparatus which is developed for the purpose of accurately diagnosing the life of a capacitor is disclosed in Patent literature 2 (JP-A-11-231008). In Patent literature 2, at a timing after at least one of application of a power source voltage and stop of the application, the voltage between terminals of a capacitor is sampled at plural points, a time constant T is obtained from the sampled voltages, the capacitance C0 of the capacitor is calculated from an expression of T/R with using a known resistance such as a resistance R of a rush current preventing resistor that is connected to the capacitor of a switching power source apparatus, and, when it is judged that the capacitance C0 of the capacitor is equal to or smaller than the theoretical worst capacitance Cr=T/(R±ΔR)+ΔC in which a change ±ΔR of the resistance R of the resistor and a change +ΔC of the capacitance of the capacitor caused by a change in ambient temperature are considered, it is judged that capacitance reduction occurs in the capacitor.

A main circuit power source discharging method in which a charging residual voltage of a capacitor is discharged as a load loss by supplying a current to an electric motor through a closed circuit including the motor-without using a dedicated discharging circuit having a discharge resistor is disclosed in Patent literature 3 (JP-A-11-89264). In Patent literature 3, when a DC input power source to a main circuit is interrupted, the control is transferred from a motor driving control to a discharge mode, and a current is supplied to the motor by forming a closed circuit including the motor, whereby the charging voltage of the capacitor is consumed and discharged as a load loss or a torque energy of driving the motor and the load.

In Patent literature 1 or Patent literature 2, since a resistor (the discharge resistor in Patent literature 1, and the rush current preventing resistor in Patent literature 2) is used in the estimation of the life of an electrolytic capacitor, there is a problem in that, when the resistance is varied by a change of the temperature surrounding the resistor, the estimation of the life of an electrolytic capacitor based on the measurement of the time constant hardly maintains the accuracy.

There are other problems as follows. When a resistor to be used for discharging of an electrolytic capacitor is set to have a small heat capacity, the resistance is increased, and hence the output current of the capacitor is reduced. Therefore, the measurement of the discharging time is prolonged. By contrast, when the resistance is reduced in order to shorten the measurement time of the discharging time, a larger power is consumed in the resistor, and hence a resistor of a larger heat capacity must be disposed. Therefore, the inverter device is increased in size.

The resistor to be used for discharging of an electrolytic capacitor is placed adjacent to the electrolytic capacitor. Even when heat of a quantity within a usable range of the resistor is generated, therefore, the temperature of the electrolytic capacitor itself is raised by the heat, thereby producing a further problem in that the heat causes the electrostatic capacitance of the electrolytic capacitor to be varied.

The invention has been conducted in order to solve these problems. It is an object of the invention to obtain an inverter device in which the life of an electrolytic capacitor can be accurately determined, and the timing of replacement of the electrolytic capacitor can be exactly determined.

DISCLOSURE OF THE INVENTION

The inverter device of the invention is an inverter device having: an electrolytic capacitor serving as a DC power source; an inverter main circuit which has switching elements, and which converts a DC voltage of the electrolytic capacitor to an AC voltage; a switching control circuit which outputs a control signal for ON/OFF-controlling the switching elements of the inverter main circuit; and an electrolytic capacitor electrostatic capacitance calculator which calculates an electrostatic capacitance of the electrolytic capacitor, wherein, when a power source connected to the electrolytic capacitor is interrupted, the switching control circuit controls the switching elements of the inverter main circuit to operate to supply a current to a load, thereby discharging charges of the electrolytic capacitor, and the electrolytic capacitor electrostatic capacitance calculator calculates the electrostatic capacitance of the electrolytic capacitor, on the basis of: a discharged charge amount which is obtained from an outflow current from the electrolytic capacitor, and a discharge time; and a discharge voltage which is a voltage drop from beginning of discharging of the electrolytic capacitor. Therefore, the electrostatic capacitance of the electrolytic capacitor can be grasped as an absolute value, and the life of the electrolytic capacitor can be correctly predicted.

In the inverter device of the invention, when a power source connected to the electrolytic capacitor is interrupted, the switching control circuit controls the switching elements of the inverter main circuit to operate to supply a current to a load, thereby discharging charges of the electrolytic capacitor, and the electrolytic capacitor electrostatic capacitance calculator calculates the electrostatic capacitance of the electrolytic capacitor, on the basis of: a discharged charge amount which is obtained from an inverter output current that is detected by a current detector disposed on a side of an output of the inverter main circuit, and ON/OFF states of the switching elements of the inverter main circuit; and a discharge voltage which is a voltage drop from beginning of discharging of the electrolytic capacitor. Therefore, a current detector which is disposed for each phase of a general purpose inverter in order to protect elements or control a load can be used as it is, and life prediction of an electrolytic capacitor can be economically realized.

In the inverter device of the invention, when a power source connected to the electrolytic capacitor is interrupted, the switching control circuit outputs a control signal for controlling an upper switching element and a lower switching element of a specific one phase of the inverter main circuit to ON/OFF-operate, upper switching elements of other phases to be always turned OFF, and lower switching elements of the other phases to be always turned ON, to supply a current to a load, thereby discharging charges of the electrolytic capacitor, and the electrolytic capacitor electrostatic capacitance calculator calculates the electrostatic capacitance of the electrolytic capacitor, on the basis of: a discharged charge amount which is obtained from a current flowing through the specific one phase in which the upper switching element and the lower switching element are ON/OFF-operated, and an ON time in ON/OFF operations; and a discharge voltage which is a voltage drop from beginning of discharging of the electrolytic capacitor. Therefore, it is not required to calculate the discharge time, and the life of the electrolytic capacitor can be correctly predicted.

In the inverter device of the invention, when a power source connected to the electrolytic capacitor is interrupted, the switching control circuit outputs a control signal for controlling an upper switching element and a lower switching element of a specific one phase of the inverter main circuit to ON/OFF-operate, upper switching elements of other phases to be always turned OFF, and lower switching elements of the other phases to be always turned ON, to supply a current to a load, thereby discharging charges of the electrolytic capacitor, and the electrolytic capacitor electrostatic capacitance calculator calculates the electrostatic capacitance of the electrolytic capacitor, on the basis of: a discharged charge amount which is obtained from an outflow current from the electrolytic capacitor, and an ON time in ON/OFF operations; and a discharge voltage which is a voltage drop from beginning of discharging of the electrolytic capacitor.

Therefore, it is possible to use a non-insulated current detector which is economical.

In the inverter device of the invention, a comparator, and a current controller for preventing an overcurrent on an output side of the comparator are disposed on an input side of the switching control circuit, the comparator comparing a current command value which is used in production of the control signal for ON/OFF-controlling the switching elements of the inverter main circuit, with a current which flows out from the electrolytic capacitor, and which is to be used in the electrolytic capacitor electrostatic capacitance calculator, or a current corresponding to the current which flows out from the electrolytic capacitor. Even when the inductance of a winding is changed during a load operation, therefore, the device can be controlled so that an overcurrent is not produced, and the electrostatic capacitance of the electrolytic capacitor can be correctly calculated.

The inverter device of the invention comprises an abnormal signal output circuit which outputs an abnormal signal when the electrostatic capacitance of the electrolytic capacitor calculated by the electrolytic capacitor electrostatic capacitance calculator is lower than a first electrostatic capacitance allowable value that is previously set.

Therefore, the user can easily determine the timing of replacement of the electrolytic capacitor.

In the abnormal signal output circuit in the inverter device of the invention, a second electrostatic capacitance allowable value which is larger than the first electrostatic capacitance allowable value can be set, and, when the electrostatic capacitance of the electrolytic capacitor calculated by the electrolytic capacitor electrostatic capacitance calculator is lower than the second electrostatic capacitance allowable value, an advance notice signal is output.

Therefore, the user can judge that the timing of replacement of the electrolytic capacitor draws near, and prepare for a work of replacement of the electrolytic capacitor.

BEST MODE FOR CARRYING OUT THE INVENTION

Embodiment 1

Figure 1:
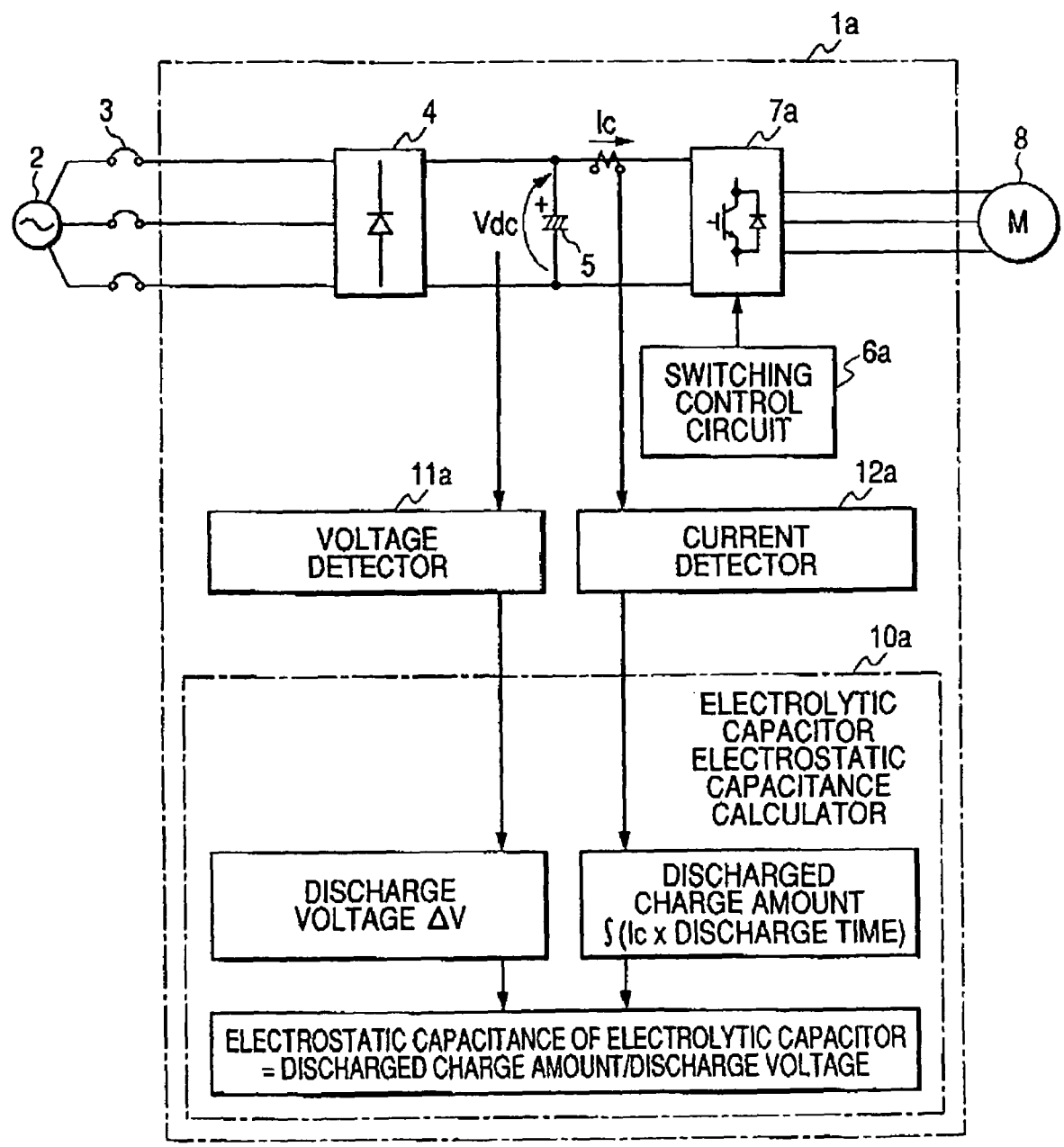
FIG. 1 is a view showing the configuration of an inverter device of Embodiment 1 of the invention.

The configuration and process of an inverter device of Embodiment 1 of the invention will be described with reference to FIG. 1. Referring to FIG. 1, the inverter device 1a is connected to a commercial power source 2 through a breaker 3, a converter 4 converts the power-frequency AC voltage of the commercial power source 2 to a DC voltage, and the converted DC voltage is smoothed by an electrolytic capacitor 5. Switching elements constituting an inverter main circuit 7a are ON/OFF-controlled by a control signal from a switching control circuit 6a, whereby a DC power is converted to an AC power of predetermined frequency and voltage to drive an electric motor 8 serving as a load.

An electrolytic capacitor electrostatic capacitance calculator 10a comprises a timer which measures a discharge time in discharging of the electrolytic capacitor, and calculates the electrostatic capacitance of the electrolytic capacitor 5 on the basis of the voltage of the electrolytic capacitor 5 detected by a voltage detector 11a, an outflow current from the electrolytic capacitor 5 detected by a current detector 12a, and the discharge time.

A method of predicting the life of the electrolytic capacitor 5 in the inverter device 1a of Embodiment 1 will be described.

When the inverter device 1a normally operates, the commercial power source is supplied to the converter 4 through the breaker 3, and an AC current which is controlled so as to have an arbitrary frequency by the inverter main circuit 7a is output to the motor 8. When the commercial power source 2 is interrupted by the breaker 3, charges remain to be accumulated in the electrolytic capacitor 5.

When switching elements of the inverter main circuit 7a are then operated to supply the charges accumulated in the electrolytic capacitor 5 to the motor 8, the charges are rapidly discharged in the motor 8. Since the motor 8 has a capacity of several kW or several tens of kW, heat generation occurring in the rapid discharging exerts no influence on the motor body. The motor 8 is not adjacent to the electrolytic capacitor 5. Even when the temperature of the body of the motor 8 is largely changed, therefore, no influence is exerted on the electrolytic capacitor 5.

During discharging, the electrolytic capacitor electrostatic capacitance calculator 10a obtains a discharge voltage ΔV which is a voltage drop from beginning of discharging, from the voltage of the electrolytic capacitor 5 detected by the voltage detector 11a. An electrolytic capacitor outflow current Ic which is a current flowing out from the electrolytic capacitor 5 detected by the current detector 12a is integrated over the discharge time t to obtain a discharged charge amount.

Then, the electrostatic capacitance C of the electrolytic capacitor 5 is calculated from Expression (1) on the basis of the discharge voltage ΔV and the discharged charge amount.

$$\text{Electrostatic capacitance } C = \text{discharged charge amount}/ \qquad (1)$$
$$\text{discharge voltage}$$
$$= \int (Ic \times t)/\Delta V$$

As described above, the voltage and the current of the electrolytic capacitor are detected, and the electrostatic capacitance of the electrolytic capacitor 5 is then obtained. Therefore, the electrostatic capacitance of the electrolytic capacitor 5 can be grasped as an absolute value, and prediction of the life of the electrolytic capacitor can be performed more correctly.

In the above, the example in which the timer which measures the discharge time in discharging of the electrolytic capacitor is disposed in the electrolytic capacitor electrostatic capacitance calculator 10a has been described. Alternatively, the discharge time may be measured by a microcomputer or the like (not shown) which is incorporated into the inverter.

Embodiment 2

Figure 2:
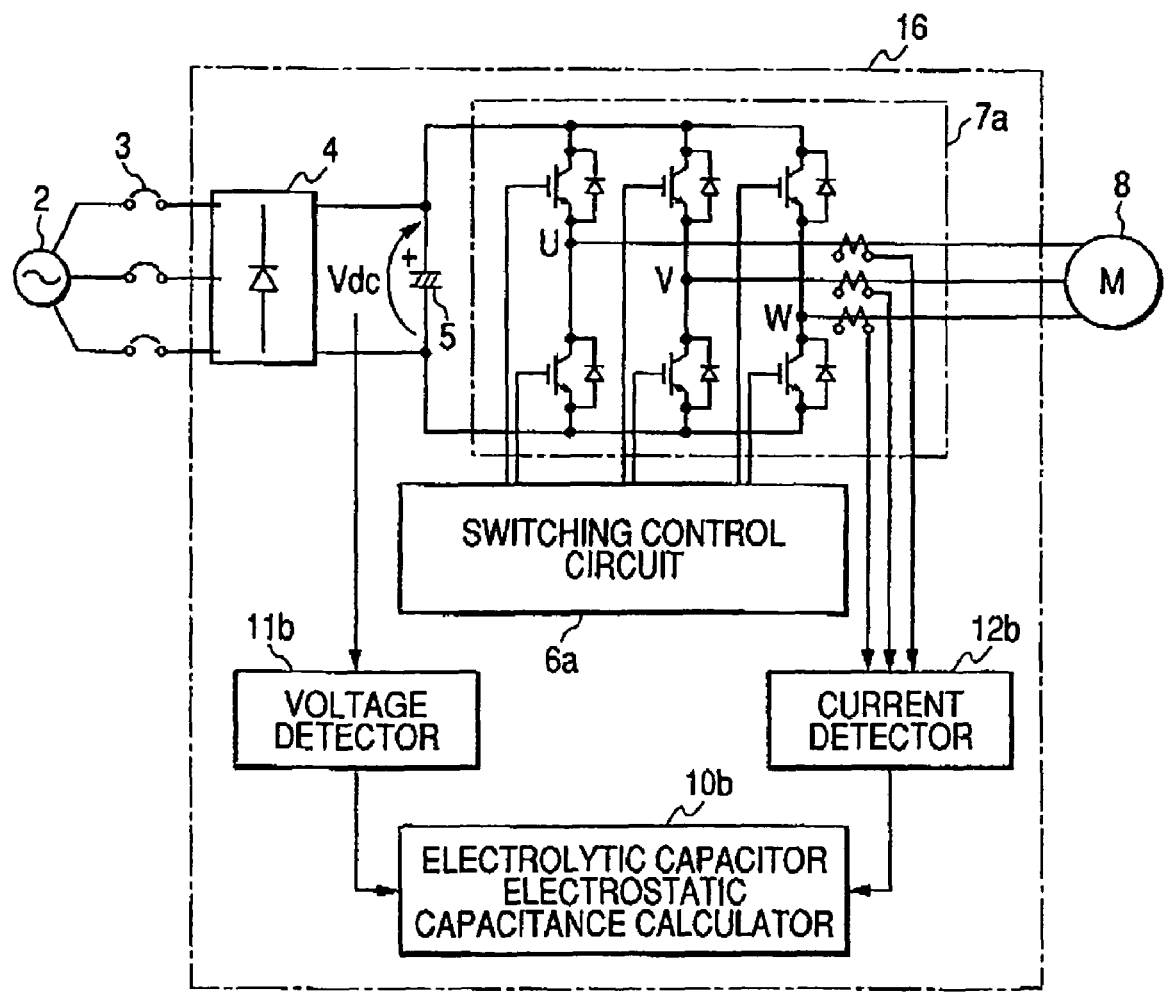
FIG. 2 is a view showing the configuration of an inverter device of Embodiment 2 of the invention.

The configuration and process of an inverter device of Embodiment 2 of the invention will be described with reference to FIG. 2. In FIG. 2, 2 to 5, 6a, 7a, and 8 denote the same components as those of FIG. 1, and their description is omitted. A voltage detector 11b is configured so as to detect the voltage of the electrolytic capacitor 5, and obtain the discharge voltage ΔV which is a voltage drop from beginning of discharging. A current detector 12b is disposed for each phase of the output of the inverter main circuit 7.

An electrolytic capacitor electrostatic capacitance calculator 10b obtains a discharged charge amount of the electrolytic capacitor 5, from inverter output currents Iu, Iv, Iw of the phases detected by the current detector 12b, and a control signal which is output from the switching control circuit 6a, and which is used for ON/OFF-controlling the switching elements constituting the inverter main circuit 7, and calculates the electrostatic capacitance of the electrolytic capacitor 5 with using the discharged charge amount and the discharge voltage ΔV of the electrolytic capacitor 5 obtained by the voltage detector 11b.

A method of calculating the charge amount and the electrostatic capacitance of the electrolytic capacitor 5 will be described with respect to (a) the case where they are obtained by an analog circuit, and (b) the case where they are obtained by using a microcomputer or the like mounted in the inverter device.

(a) The case where the charge amount and the electrostatic capacitance are obtained by an analog circuit.

When the inverter output currents of the phases are indicated by Iu, Iv, Iw, and a variable sign representing the switching status of each phase is set so that, when an upper switching element is ON, sign=1, and, when a lower switching element is ON, sign=−1, the discharged charge amount of the electrolytic capacitor can be calculated from Expression (2). In this case, it is assumed that Iu, Iv, Iw are polarized and the direction from the inverter device to the load is set as positive.

$$\text{Discharged charge amount of electrolytic capacitor} = \int (\tfrac{1}{2}) \times \{Iu \times \text{sign}(u) + Iv \times \text{sign}(v) + Iw \times \text{sign}(w)\} dt \qquad (2)$$

The electrostatic capacitance C of the electrolytic capacitor 5 is obtained from Expression (3) with using the discharged charge amount of the electrolytic capacitor calculated by Expression (2), and the discharge voltage ΔV which is a voltage drop from beginning of discharging.

$$\text{Electrostatic capacitance } C = \int (1/2) \times \{Iu \times \text{sign}(u) + Iv \times \text{sign}(v) + Iw \times \text{sign}(w)\} dt / \Delta V \qquad (3)$$

(b) The case where the charge amount and the electrostatic capacitance are obtained by using a microcomputer or the like mounted in the inverter device.

When the inverter output currents of the phases are indicated by Iu, Iv, Iw, the ON times of upper switching elements of the phases are indicated by UPon, VPon, WPon, and the switching period is T, the discharged charge amount of the electrolytic capacitor 5 can be calculated from Expression (4).

$$\text{Discharged charge amount of electrolytic capacitor} = \Sigma (Iu \times UPon/T + Iv \times VPon/T + Iw \times WPon/T) \qquad (4)$$

The electrostatic capacitance C of the electrolytic capacitor 5 is obtained from Expression (5).

$$\text{Electrostatic capacitance } C = \Sigma(Iu \times UPon/T + Iv \times VPon/T + Iw \times WPon/T)/\Delta V \qquad (5)$$

As described above, in the inverter device 1b of Embodiment 2, the electrostatic capacitance of the electrolytic capacitor 5 is calculated with using the ON/OFF states of the switching elements constituting the inverter main circuit 7a.

The inverter device 1a of Embodiment 1 is the example in which the outflow current from the electrolytic capacitor 5 is detected by the dedicated current detector 12a. By contrast, the inverter device 1b of Embodiment 2 uses the current detector 12b which is attached for each phase of the output of the inverter main circuit 7 in a general purpose inverter in order to protect elements or control a motor. Therefore, the detection can be performed at low cost.

Embodiment 3

Figure 3:
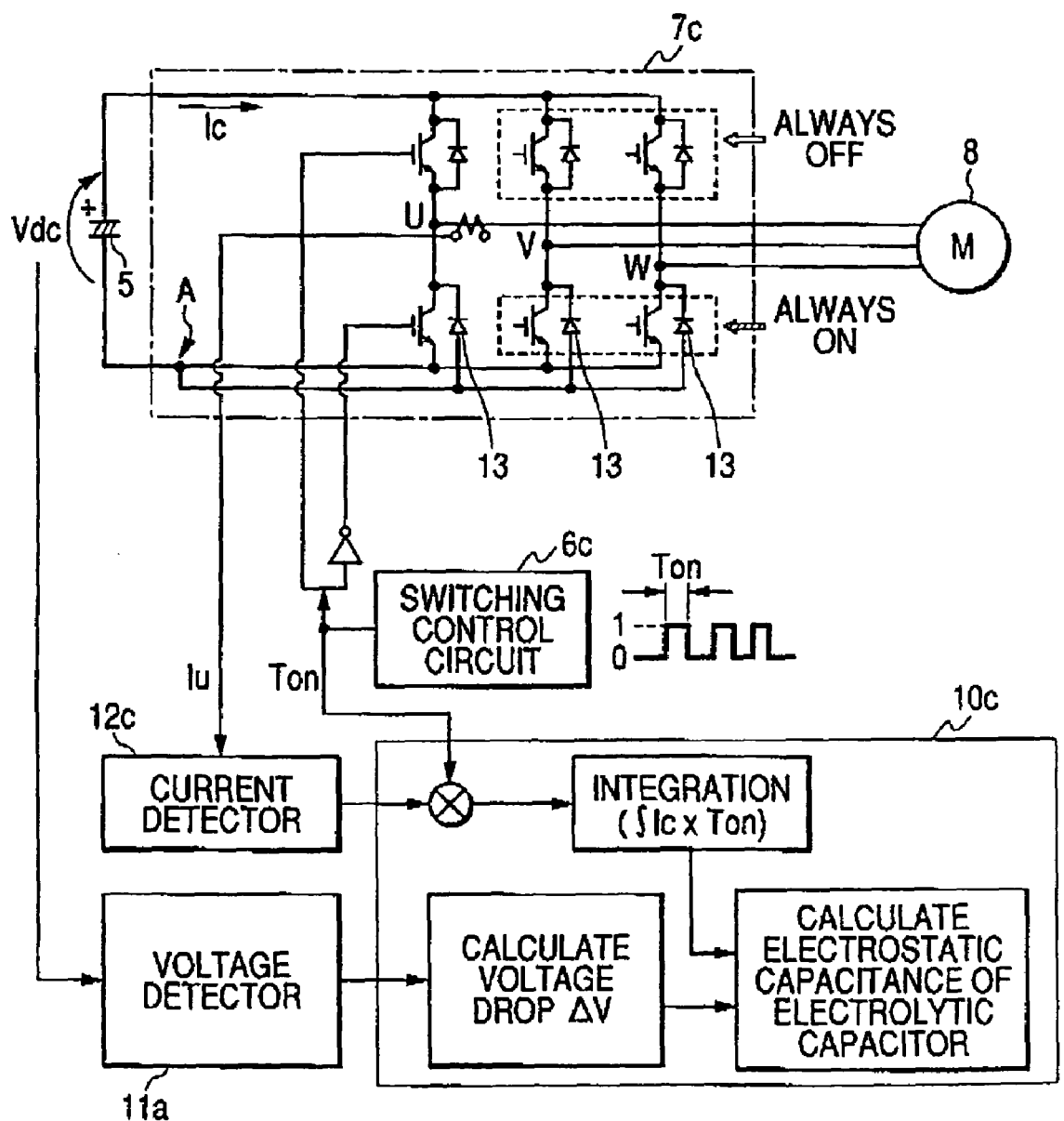
FIG. 3 is a view showing the configuration of an inverter device of Embodiment 3 of the invention.

The configuration and process of an inverter device of Embodiment 3 of the invention will be described with reference to FIG. 3. In FIGS. 3, 5, 8, and 11a denote the same components as those of FIG. 1, and their description is omitted. When the commercial power source is interrupted, a switching control circuit 6c outputs a control signal for ON/OFF-controlling only switching elements of the U phase, and for, with respect to the V and W phases, always turning OFF upper switching elements, and always turning ON lower switching elements. A current detector 12c is disposed on the output side of the U phase (the specific one phase which is to be ON/OFF-operated when the commercial power source is interrupted).

In an inverter main circuit 7c, diode elements 13 are connected in parallel to the lower switching elements of the two phases which are always turned ON, so that a circuit configuration is formed which ensures a current path in the state where, in the specific phase which is to be ON/OFF-operated, the upper switching element is, turned OFF and the lower switching element is turned ON. In the case where the upper switching element of the U phase is turned OFF and the lower switching element is turned ON, the electrolytic capacitor outflow current Ic which is a current flowing out from the electrolytic capacitor 5 flows through the path of the lower switching element of the U phase→the lower diode elements of the V and W phases→the motor 8→the lower switching element of the U phase. When the current flowing through the U phase is indicated by Iu, the current flowing through the V phase by IV, and the current flowing through the W phase by Iw, the electrolytic capacitor outflow current Ic is Ic=Iu=IV+Iw.

An electrolytic capacitor electrostatic capacitance calculator 10c calculates the electrostatic capacitance C of the electrolytic capacitor 5 with using the ON time Ton of the upper switching element of the specific one phase which is to be ON/OFF-operated, a voltage drop ΔV between the terminals of the electrolytic capacitor 5, and the current Iu flowing through the U phase (=the electrolytic capacitor outflow current Ic).

A process of calculating the electrostatic capacitance of the electrolytic capacitor in the inverter device of Embodiment 3 of the invention will be described with reference to FIGS. 3, 4, and 5.

When the commercial power source is interrupted, the switching elements of the inverter main circuit 7c are caused to perform the above-mentioned ON/OFF operations, and discharging of the electrolytic capacitor 5 is started.

Figure 4:
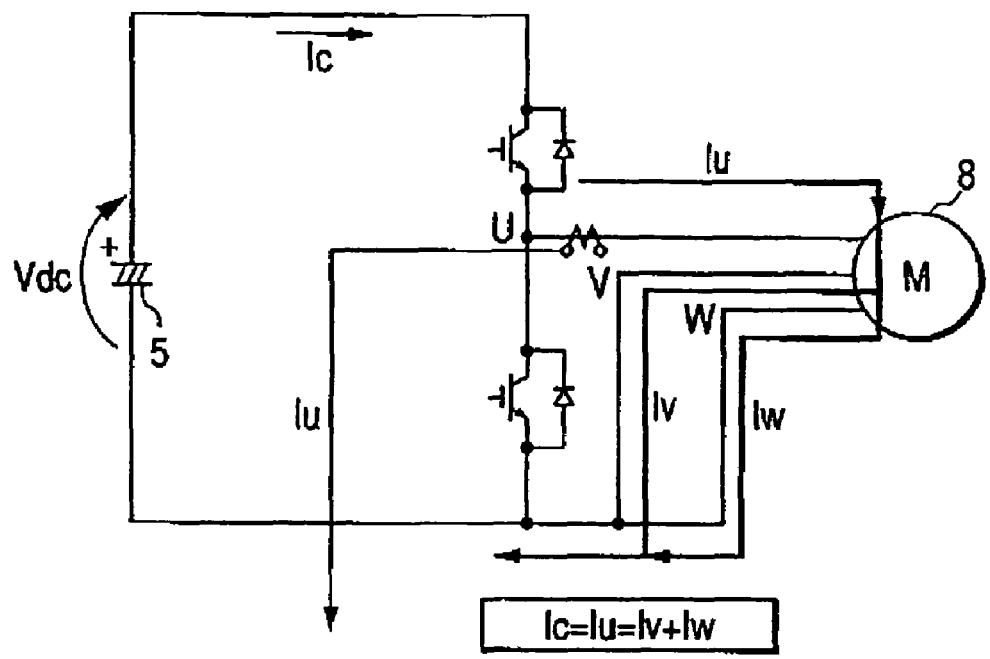
FIG. 4 is a view showing an equivalent circuit of an inverter main circuit of the inverter device of Embodiment 3 of the invention.

FIG. 4 shows the path of the electrolytic capacitor outflow current Ic when, in the case where the upper switching elements of the V and W phases are always turned OFF, the lower switching elements are always turned ON, and only the switching elements of the U phase are ON/OFF-operated, the upper switching element of the U phase is turned ON and the lower switching element is turned OFF. The current flows through the path of the electrolytic capacitor 5→the upper switching element of the U phase→the motor 8→the lower switching elements of the V and W phases (the current flows equally through the V and W phases)→the electrolytic capacitor 5.

Figure 5:
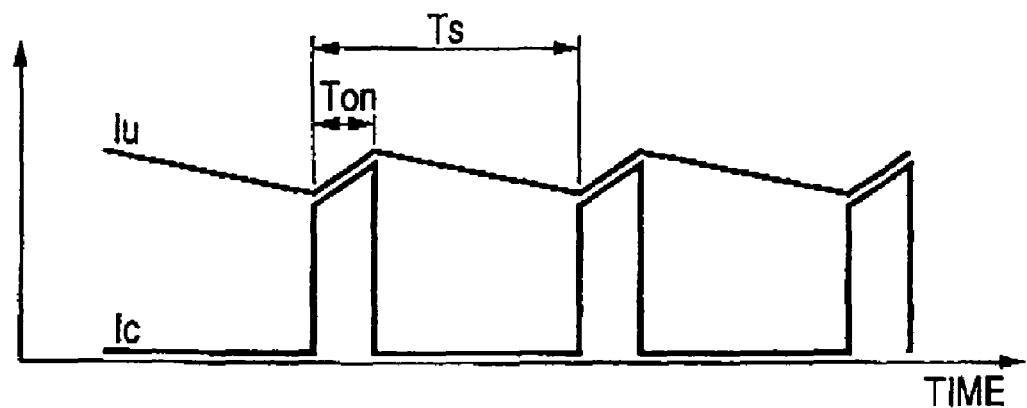
FIG. 5 is a view showing relationships between an electrolytic capacitor outflow current Ic and a U-phase current Iu in the inverter device of Embodiment 3 of the invention.

With respect to the U-phase current Iu detected by the current detector 12c, as shown in FIG. 5 the electrolytic capacitor outflow current Ic flows during the ON time Ton when the upper switching element of the U phase is turned ON, and hence charges of the electrolytic capacitor 5 are discharged so that the U-phase current Iu is increased. By contrast, during the time (Ts−Ton) which is equal to the carrier period Ts other than the ON time Ton, and in which the upper switching element of the U phase is turned OFF and the lower switching element of the U phase is turned ON, charges of the electrolytic capacitor 5 are not discharged, and the U-phase current IU is reduced. Only during the ON time Ton obtained from an ON command which is output from the switching control circuit 6c to the upper switching element of the U phase, therefore, the charges accumulated in the electrolytic capacitor 5 are discharged, so that the discharge time=the ON time Ton.

The electrolytic capacitor electrostatic capacitance calculator 10c then multiplies the U-phase current Iu detected by the current detector 12c with the discharge time (=the ON time Ton obtained from the ON command which is output from the switching control circuit 6c to the upper switching element of the U phase), and integrates the product. From the voltage Vdc of the electrolytic capacitor 5 detected by the voltage detector 11a, the difference between the voltage of the electrolytic capacitor at the beginning of discharging and that of the electrolytic capacitor during discharging is obtained, and the discharge voltage ΔV which is a voltage drop is obtained.

The electrostatic capacitance C of the electrolytic capacitor 5 is obtained by Expression (6) from: the discharged charge amount of the electrolytic capacitor 5 which is obtained by integrating the U-phase current Iu over the ON time Ton obtained from the ON command output to the upper switching element of the U phase; and the discharge voltage ΔV.

$$\text{Electrostatic capacitance } C = \int (Iu \times Ton)/\Delta V \tag{6}$$

In the above, the example in which only the U phase is ON/OFF operated, and, with respect to the V and W phases, the upper switching elements are always turned OFF and the lower switching elements are always turned ON has been described. The same effects can be attained also when the specific one phase which is to be ON/OFF-operated is the V phase or the W phase. In this case, the current detector 12c is disposed for the V phase or the W phase.

Embodiment 4

Figure 6:
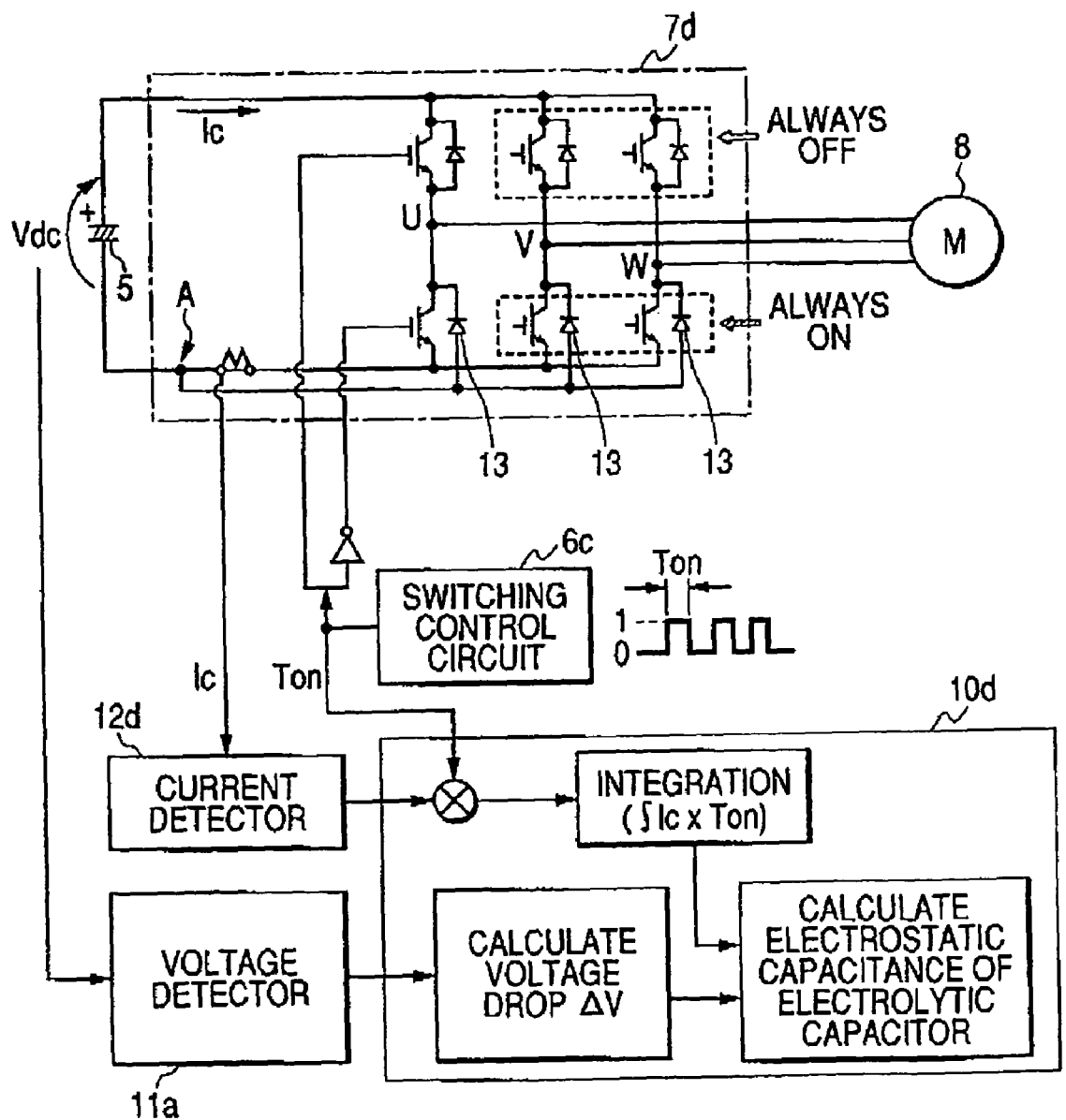
FIG. 6 is a view showing the configuration of an inverter device of Embodiment 4 of the invention.

The configuration and process of an inverter device of Embodiment 4 of the invention will be described with reference to FIG. 6. In FIGS. 6, 5, 6c, 8, 11a, and 13 denote the same components as those of FIG. 3, and their description is omitted. A current detector 12d is disposed between a lower switching element of an inverter main circuit 7d and the electrolytic capacitor 5.

An electrolytic capacitor electrostatic capacitance calculator 10d calculates the electrostatic capacitance C of the electrolytic capacitor 5 with using the ON time Ton of the upper switching element of the specific one phase which is to be ON/OFF-operated, a voltage drop ΔV between the terminals of the electrolytic capacitor 5, and the electrolytic capacitor outflow current Ic.

A process of calculating the electrostatic capacitance of the electrolytic capacitor in the inverter device of Embodiment 4 of the invention will be described with reference to FIGS. 6 and 7.

When the commercial power source is interrupted, the switching elements of the inverter main circuit 7d are caused to perform the above-mentioned ON/OFF operations, and discharging of the electrolytic capacitor 5 is started.

Figure 7:
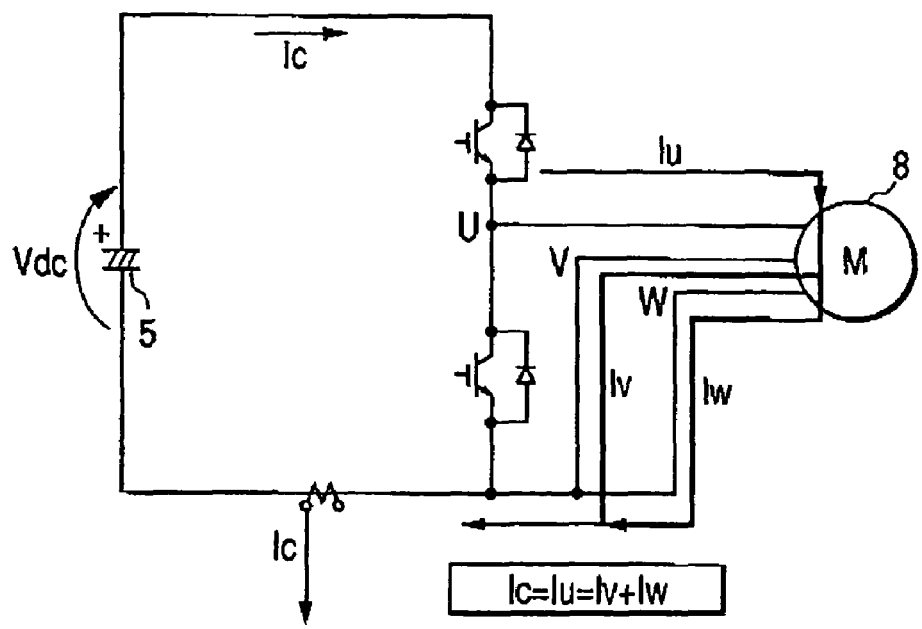
FIG. 7 is a view showing an equivalent circuit of an inverter main circuit of the inverter device of Embodiment 4 of the invention.

FIG. 7 shows the path of the electrolytic capacitor outflow current Ic when, in the case where the upper switching elements of the V and W phases are always turned OFF, the lower switching elements are always turned ON, and only the switching elements of the U phase are ON/OFF-operated, the upper switching element of the U phase is turned ON and the lower switching element is turned OFF. The current flows through the path of the electrolytic capacitor 5→the upper switching element of the U phase→the motor 8→the lower switching elements of the V and W phases (the current flows equally through the V and W phases)→the electrolytic capacitor 5. When the current flowing through the U phase is indicated by Iu, the current flowing through the V phase by Iv, and the current flowing through the W phase by Iu, the electrolytic capacitor outflow current Ic is Ic=Iu=Iv+Iw.

The electrolytic capacitor electrostatic capacitance calculator 10d multiplies the electrolytic capacitor outflow current Ic detected by the current detector 12d with the discharge time (=the ON time Ton obtained from the ON command which is output from the switching control circuit 6c to the upper switching element of the U phase), and integrates the product. The electrolytic capacitor electrostatic capacitance calculator 10d calculates the electrostatic capacitance C of the electrolytic capacitor 5 by Expression (7) from: the ON time Ton of the upper switching element of the specific one phase which is to be ON/OFF-operated; and the discharge voltage ΔV between the terminals of the electrolytic capacitor 5; and the electrolytic capacitor outflow current Ic.

Electrostatic capacitance $C = \int (Ic \times Ton)/\Delta V$ (7)

The above Expression (7) for calculating the electrostatic capacitance C of the electrolytic capacitor 5 is obtained by replacing the U-phase current Iu of Expression (6) for calculating the electrostatic capacitance C of the electrolytic capacitor 5 in Embodiment 3, with the electrolytic capacitor outflow current Ic.

In Embodiment 3, the current detector 12c is disposed in the output of the specific one phase (the U phase in FIG. 3) which is to be ON/OFF-operated when the commercial power source is interrupted, and, in the case where the switching elements are controlled so that only the switching elements of the U phase are ON/OFF-operated and, with respect to the V and W phases, the upper switching elements are always turned OFF and the lower switching elements are always turned ON, the electrolytic capacitor outflow current Ic=the current Iu flowing through the U phase. Therefore, the current Iu flowing through the U phase is used in place of the electrolytic capacitor outflow current Ic.

In the method in which the current to be used for calculating the electrostatic capacitance of the electrolytic capacitor is detected by the current detector 12c disposed in the output of the inverter as shown in FIG. 3, when a power source (not shown) for the control circuits is set to be equal to the potential of the point A, insulation is required, and hence an insulated current detector must be used.

In Embodiment 4, the current detector 12d is disposed between the electrolytic capacitor 5 and the lower switching elements of the inverter main circuit 7d. Even when the power source for the control circuits is set to be equal to the potential of the point A, therefore, a non-insulated current detector can be used as the current detector. For example, an economical shunt resistor may be used.

In the above, the example in which the current detector 12d for detecting the electrolytic capacitor outflow current IC is disposed between the electrolytic capacitor 5 and the lower switching elements of the inverter main circuit 7d has been described. The same effects can be attained also when a current detector is disposed between the lower switching element of the U phase and that of the V phase.

Embodiment 5

Figure 8:
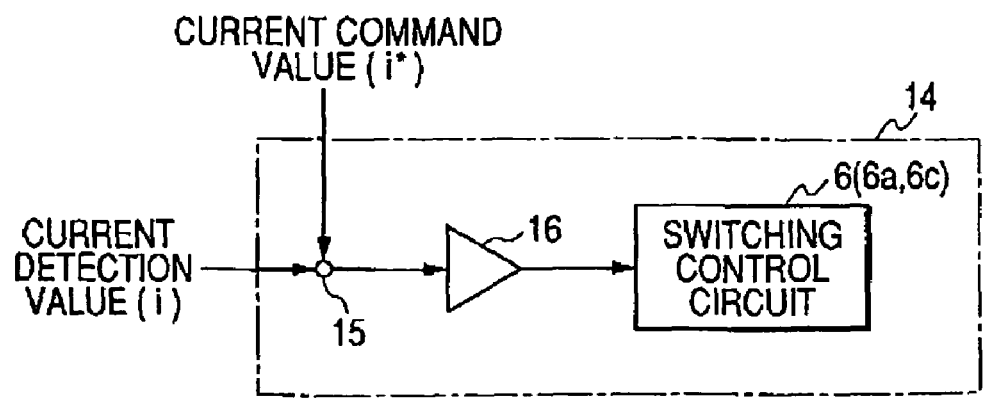
FIG. 8 is a view showing the configuration of a switching control circuit in an inverter device of Embodiment 5 of the invention.

A switching control circuit in an inverter device of Embodiment 5 of the invention will be described with reference to FIG. 8.

In the switching control circuit 14 in the inverter device of Embodiment 5, a comparator 15 which compares a current command value i* with a current detection value i, and a current controller 16 for preventing an overcurrent are disposed on the input side of a switching control circuit 6 (6a, 6c) which outputs a control signal for ON/OFF-controlling the switching elements of an inverter main circuit (not shown), thereby forming a current loop. Even when the inductance of a winding is changed during a load operation, therefore, the device can be controlled so that an overcurrent is not produced, and the electrostatic capacitance of the electrolytic capacitor can be correctly calculated.

Embodiment 6

Figure 9:
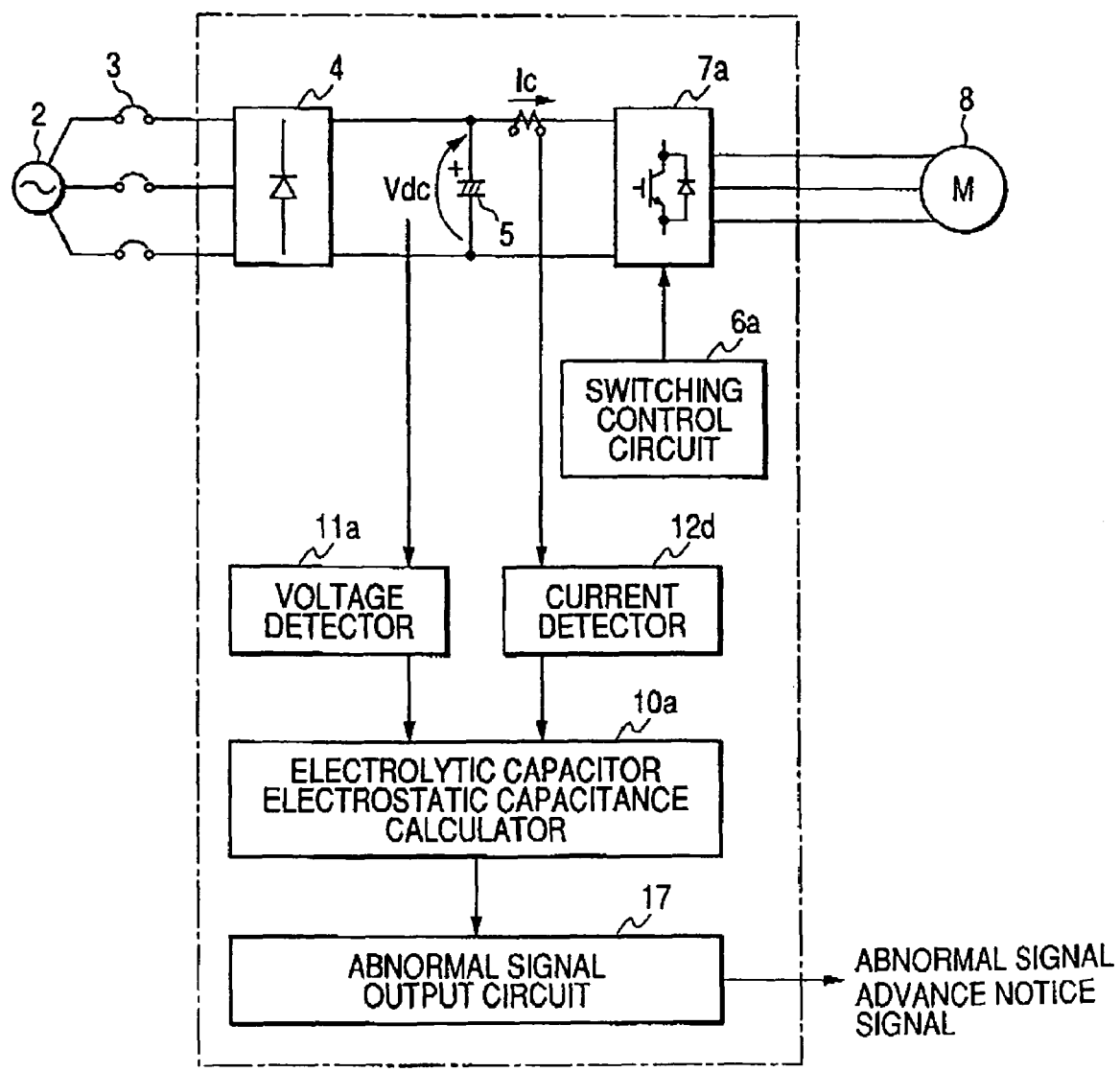
FIG. 9 is a view showing the configuration of an inverter device of Embodiment 6 of the invention.

The configuration and process of an inverter device of Embodiment 6 of the invention will be described with reference to FIG. 9. In the FIGS. 2 to 5, 6a, 7a, 8, 10a, 11a, and 12a denote the same components as those of FIG. 1, and their description is omitted.

In the inverter device 1e of Embodiment 6, an abnormal signal output circuit 16 outputs an abnormal signal when the electrostatic capacitance of the electrolytic capacitor 5 calculated by the electrolytic capacitor electrostatic capacitance calculator 10a is lower than a first electrostatic capacitance allowable value. When the electrostatic capacitance of the electrolytic capacitor 5 is lower than a second electrostatic capacitance allowable value which is larger than the first electrostatic capacitance allowable value, the abnormal signal output circuit 17 outputs an advance notice signal.

In the inverter device 1e of Embodiment 6, when the electrostatic capacitance of the electrolytic capacitor 5 is lower than the first electrostatic capacitance allowable value, the abnormal signal is output. Therefore, the user can easily determine the timing of replacement of the electrolytic capacitor. The second electrostatic capacitance allowable value which is larger than the first electrostatic capacitance allowable value for determining the timing of replacement of the electrolytic capacitor is previously set, and, when the electrostatic capacitance of the electrolytic capacitor 5 is lower than the second electrostatic capacitance allowable value, the advance notice signal is output. Therefore, the user can judge that the timing of replacement of the electrolytic capacitor draws near, and prepare for a work of replacement of the electrolytic capacitor. Consequently, the stop time of the inverter device during a work of replacing the electrolytic capacitor can be minimized.

In Embodiments 1 to 6, the examples in which the electric motor 8 is used as the load have been described. Even when the load is an inductive load such as an inductive heating apparatus or an ozone generator, the electrostatic capacitance of the electrolytic capacitor 5 can be similarly obtained, and correct life prediction can be performed.

INDUSTRIAL APPLICABILITY

As described above, in the inverter device of the invention, the life of an electrolytic capacitor can be accurately determined, and the timing of replacement of the electrolytic capacitor can be exactly determined. Therefore, the inverter device is suitable as an inverter device which is to be installed in a place where it is difficult to perform an inspection for measuring the life of an electrolytic capacitor from the outside.

The invention claimed is:

1. An inverter device comprising:
an electrolytic capacitor serving as a DC power source;
an inverter main circuit which has switching elements, and which converts a DC voltage of said electrolytic capacitor to an AC voltage;
a switching control circuit which outputs a control signal for ON/OFF-controlling said switching elements of said inverter main circuit; and
an electrolytic capacitor electrostatic capacitance calculator which calculates an electrostatic capacitance of said electrolytic capacitor, wherein
when a power source connected to said electrolytic capacitor is interrupted, said switching control circuit controls said switching elements of said inverter main circuit to operate to supply a current to a load, thereby discharging charges of said electrolytic capacitor, and
said electrolytic capacitor electrostatic capacitance calculator calculates the electrostatic capacitance of said electrolytic capacitor, on the basis of a discharged charge amount which is obtained from an inverter output current that is detected by a current detector disposed on a side of an output of said inverter main circuit, ON/OFF time ratio of said switching elements of said inverter main circuit, and a discharge voltage which is a voltage drop from a beginning of discharging of said electrolytic capacitor.

2. An inverter device according to claim 1, wherein a comparator, and a current controller for preventing an overcurrent on an output side of said comparator are disposed on an input side of said switching control circuit, said comparator comparing a current command value which is used in production of the control signal for ON/OFF-controlling said switching elements of said inverter main circuit, with a current which flows out from said electrolytic capacitor, and which is to be used in said electrolytic capacitor electrostatic capacitance calculator, or a current corresponding to the current which flows out from said electrolytic capacitor.

3. An inverter device according to claim 2, wherein said inverter device comprises an abnormal signal output circuit which outputs an abnormal signal when the electrostatic capacitance of said electrolytic capacitor calculated by said electrolytic capacitor electrostatic capacitance calculator is lower than a first electrostatic capacitance allowable value that is previously set.

4. An inverter device according to claim 1, wherein said inverter device comprises an abnormal signal output circuit which outputs an abnormal signal when the electrostatic capacitance of said electrolytic capacitor calculated by said electrolytic capacitor electrostatic capacitance calculator is lower than a first electrostatic capacitance allowable value that is previously set.

5. An inverter device according to claim 4, wherein, in said abnormal signal output circuit, a second electrostatic capacitance allowable value which is larger than the first electrostatic capacitance allowable value can be set, and, when the electrostatic capacitance of said electrolytic capacitor calculated by said electrolytic capacitor electrostatic capacitance calculator is lower than the second electrostatic capacitance allowable value, an advance notice signal is output.

6. An inverter device comprising:
an electrolytic capacitor serving as a DC power source;
an inverter main circuit which has switching elements, and which converts a DC voltage of said electrolytic capacitor to an AC voltage;
a switching control circuit which outputs a control signal for ON/OFF-controlling said switching elements of said inverter main circuit; and
an electrolytic capacitor electrostatic capacitance calculator which calculates an electrostatic capacitance of said electrolytic capacitor, wherein
when a power source connected to said electrolytic capacitor is interrupted, said switching control circuit outputs a control signal for controlling an upper switching element and a lower switching element of a specific one phase of said inverter main circuit to ON/OFF-operate, upper switching elements of other phases to be always turned OFF, and lower switching elements of said other phases to be always turned ON, to supply a current to a load, thereby discharging charges of said electrolytic capacitor, and
said electrolytic capacitor electrostatic capacitance calculator calculates the electrostatic capacitance of said electrolytic capacitor, on the basis of a discharged charge amount which is obtained from a current flowing through said specific one phase in which said upper switching element and said lower switching element are ON/OFF-operated, and an ON time in ON/OFF operations, and a discharge voltage which is a voltage drop from beginning of discharging of said electrolytic capacitor.

7. An inverter device according to claim 6, wherein a comparator, and a current controller for preventing an overcurrent on an output side of said comparator are disposed on an input side of said switching control circuit, said comparator comparing a current command value which is used in production of the control signal for ON/OFF-controlling said switching elements of said inverter main circuit, with a current which flows out from said electrolytic capacitor, and which is to be used in said electrolytic capacitor electrostatic capacitance calculator, or a current corresponding to the current which flows out from said electrolytic capacitor.

8. An inverter device according to claim 6, wherein said inverter device comprises an abnormal signal output circuit which outputs an abnormal signal when the electrostatic capacitance of said electrolytic capacitor calculated by said electrolytic capacitor electrostatic capacitance calculator is lower than a first electrostatic capacitance allowable value that is previously set.

9. An inverter device according to claim 8, wherein, in said abnormal signal output circuit, a second electrostatic capacitance allowable value which is larger than the first electrostatic capacitance allowable value can be set, and, when the electrostatic capacitance of said electrolytic capacitor calculated by said electrolytic capacitor electrostatic capacitance calculator is lower than the second electrostatic capacitance allowable value, an advance notice signal is output.

10. An inverter device comprising:

an electrolytic capacitor serving as a DC power source; an inverter main circuit which has switching elements, and which converts a DC voltage of said electrolytic capacitor to an AC voltage;

a switching control circuit which outputs a control signal for ON/OFF-controlling said switching elements of said inverter main circuit; and an electrolytic capacitor electrostatic capacitance calculator which calculates an electrostatic capacitance of said electrolytic capacitor, wherein when a power source connected to said electrolytic capacitor is interrupted, said switching control circuit outputs a control signal for controlling an upper switching element and a lower switching element of a specific one phase of said inverter main circuit to ON/OFF-operate, upper switching elements of other phases to be always turned OFF, and lower switching elements of said other phases to be always turned ON, to supply a current to a load, thereby discharging charges of said electrolytic capacitor, and said electrolytic capacitor electrostatic capacitance calculator calculates the electrostatic capacitance of said electrolytic capacitor, on the basis of a discharged charge amount which is obtained from an outflow current from said electrolytic capacitor, and an ON time in ON/OFF operations, and a discharge voltage which is a voltage drop from beginning of discharging of said electrolytic capacitor.

11. An inverter device according to claim 10, wherein a comparator, and a current controller for preventing an overcurrent on an output side of said comparator are disposed on an input side of said switching control circuit, said comparator comparing a current command value which is used in production of the control signal for ON/OFF-controlling said switching elements of said inverter main circuit, with a current which flows out from said electrolytic capacitor, and which is to be used in said electrolytic capacitor electrostatic capacitance calculator, or a current corresponding to the current which flows out from said electrolytic capacitor.

12. An inverter device according to claim 11, wherein, in said abnormal signal output circuit, a second electrostatic capacitance allowable value which is larger than the first electrostatic capacitance allowable value can be set, and, when the electrostatic capacitance of said electrolytic capacitor calculated by said electrolytic capacitor electrostatic capacitance calculator is lower than the second electrostatic capacitance allowable value, an advance notice signal is output.

13. An inverter device according to claim 10, wherein said inverter device comprises an abnormal signal output circuit which outputs an abnormal signal when the electrostatic capacitance of said electrolytic capacitor calculated by said electrolytic capacitor electrostatic capacitance calculator is lower than a first electrostatic capacitance allowable value that is previously set.

14. An inverter device according to claim 13, wherein, in said abnormal signal output circuit, a second electrostatic capacitance allowable value which is larger than the first electrostatic capacitance allowable value can be set, and, when the electrostatic capacitance of said electrolytic capacitor calculated by said electrolytic capacitor electrostatic capacitance calculator is lower than the second electrostatic capacitance allowable value, an advance notice signal is output.

15. An inverter device comprising:

an electrolytic capacitor serving as a DC power source;

an inverter main circuit which has switching elements, and which converts a DC voltage of said electrolytic capacitor to an AC voltage;

a switching control circuit which outputs a control signal for ON/OFF-controlling said switching elements of said inverter main circuit; and an electrolytic capacitor electrostatic capacitance calculator which calculates an electrostatic capacitance of said electrolytic capacitor, wherein when a power source connected to said electrolytic capacitor is interrupted, said switching control circuit controls said switching elements of said inverter main circuit to operate to supply a current to a load, thereby discharging charges of said electrolytic capacitor, and said electrolytic capacitor electrostatic capacitance calculator calculates the electrostatic capacitance of said electrolytic capacitor, on the basis of a discharged charge amount which is obtained from an outflow current from said electrolytic capacitor, a discharge time, and a discharge voltage which is a voltage drop from a beginning of discharging of said electrolytic capacitor, wherein a comparator, and a current controller for preventing an overcurrent on an output side of said comparator are disposed on an input side of said switching control circuit, said comparator comparing a current command value which is used in production of the control signal for ON/OFF-controlling said switching elements of said inverter main circuit, with a current which flows out from said electrolytic capacitor, and which is to be used in said electrolytic capacitor electrostatic capacitance calculator, or a current corresponding to the current which flows out from said electrolytic capacitor.

16. An inverter device according to claim 15, wherein said inverter device comprises an abnormal signal output circuit which outputs an abnormal signal when the electrostatic capacitance of said electrolytic capacitor calculated by said electrolytic capacitor electrostatic capacitance calculator is lower than a first electrostatic capacitance allowable value that is previously set.

17. An inverter device according to claim 16, wherein, in said abnormal signal output circuit, a second electrostatic capacitance allowable value which is larger than the first electrostatic capacitance allowable value can be set, and, when the electrostatic capacitance of said electrolytic capacitor calculated by said electrolytic capacitor electrostatic capacitance calculator is lower than the second electrostatic capacitance allowable value, an advance notice signal is output.

18. An inverter device comprising:

an electrolytic capacitor serving as a DC power source;

an inverter main circuit which has switching elements, and which converts a DC voltage of said electrolytic capacitor to an AC voltage;

a switching control circuit which outputs a control signal for ON/OFF-controlling said switching elements of said inverter main circuit; and an electrolytic capacitor electrostatic capacitance calculator which calculates an electrostatic capacitance of said electrolytic capacitor, wherein when a power source connected to said electrolytic capacitor is interrupted, said switching control circuit controls said switching elements of said inverter main circuit to operate to supply a current to a load, thereby discharging charges of said electrolytic capacitor, and said electrolytic capacitor electrostatic capacitance calculator calculates the electrostatic capacitance of said electrolytic capacitor, on the basis of a discharged charge amount which is obtained from an outflow current from said electrolytic capacitor, a discharge time, and a discharge voltage which is a voltage drop from a beginning of discharging of said electrolytic capacitor, wherein said inverter device comprises an abnormal signal output circuit which outputs an abnormal signal when the electrostatic capacitance of said electrolytic capacitor calculated by said electrolytic capacitor electrostatic capacitance calculator is lower than a first electrostatic capacitance allowable value that is previously set, wherein, in said abnormal signal output circuit, a second electrostatic capacitance allowable value which is larger than the first electrostatic capacitance allowable value can be set, and, when the electrostatic capacitance of said electrolytic capacitor calculated by said electrolytic capacitor electrostatic capacitance calculator is lower than the second electrostatic capacitance allowable value, an advance notice signal is output.

* * * * *